US012761713B2

(12) United States Patent
Quan et al.

(10) Patent No.: US 12,761,713 B2
(45) Date of Patent: Oct. 13, 2026

(54) METHODS AND SYSTEMS FOR DYNAMIC OUTPUT FROM POWER SUPPLY

(71) Applicant: Lenovo (United States) Inc., Morrisville, NC (US)

(72) Inventors: Shenxian Quan, Kanagawa (JP); Yue Tan, Beijing (CN); Chihsiu Liu, Taipei City (TW); Hiroshi Nakagawa, Kanagawa (JP); Yoshihito Nakagaki, Kanagawa (JP)

(73) Assignee: Lenovo (United States) Inc.

( * ) Notice: Subject to any disclaimer, the term of this patent is extended or adjusted under 35 U.S.C. 154(b) by 78 days.

(21) Appl. No.: 19/016,580

(22) Filed: Jan. 10, 2025

(65) Prior Publication Data

US 2026/0202896 A1 Jul. 16, 2026

(51) Int. Cl.

| | |
|---|---|
| ***G06F 1/00*** | (2006.01) |
| ***G06F 1/20*** | (2006.01) |
| ***G06F 1/28*** | (2006.01) |
| ***G06F 11/30*** | (2006.01) |
| ***H05K 7/20*** | (2006.01) |

(52) U.S. Cl.

CPC ................ *G06F 1/28* (2013.01); *G06F 1/206* (2013.01); *H05K 7/2089* (2013.01)

(58) Field of Classification Search

CPC .................................. G06F 1/28; G06F 1/206

See application file for complete search history.

(56) References Cited

U.S. PATENT DOCUMENTS

| | | | | |
|---|---|---|---|---|
| 8,068,340 | B1 * | 11/2011 | Nguyen | H05K 7/20172 174/547 |
| 2009/0106567 | A1 * | 4/2009 | Baarman | G06F 1/26 307/104 |
| 2016/0091938 | A1 | 3/2016 | Edwards et al. | |
| 2021/0046834 | A1 * | 2/2021 | Loacker | B60L 53/22 |
| 2022/0243935 | A1 * | 8/2022 | Chen | H05K 7/20736 |
| 2022/0255318 | A1 * | 8/2022 | Yoshikuwa | B25J 5/007 |
| 2026/0050311 | A1 * | 2/2026 | Shirota | G06F 1/263 |

OTHER PUBLICATIONS

Extended European Search Report issued in the counterpart European Application No. 25210562.2, mailed Mar. 20, 2026 (9 pages).

* cited by examiner

*Primary Examiner* — Mohammed H Rehman

(74) *Attorney, Agent, or Firm* — Osha Bergman Watanabe & Burton LLP

(57) ABSTRACT

A power supply system includes a power supply device with an adjustable output power limit. The power supply device includes a rectangular body having a height greater than a width. The power supply system further includes an orientation sensor and a controller. The controller receives an orientation signal from the orientation sensor, adjusts the output power limit to a first power level in response to the orientation signal indicating that the rectangular body is oriented with the width substantially parallel to a direction of gravity, and adjusts the output power limit to a second power level greater than the first power level in response to the orientation signal indicating that the rectangular body is oriented with the height substantially parallel to the direction of gravity. In addition, the controller outputs power from the power supply device at a level less than or equal to the output power limit.

14 Claims, 4 Drawing Sheets

METHODS AND SYSTEMS FOR DYNAMIC OUTPUT FROM POWER SUPPLY

BACKGROUND

Modern computers are becoming increasingly powerful and capable of executing difficult and intensive processes. With the increasing capabilities of computers, the power that they demand may vary significantly depending on the processes carried out by the user. For example, operating single applications (e.g., a web browser or email) requires little energy. By contrast, a greater amount of energy must be provided to the computers to support computationally intensive processes (e.g., multitasking with multiple applications, gaming, video editing and rendering, training or deploying artificial intelligence models, etc.). However, conventional power supply devices have a fixed output power limit, and such power supply devices either interrupt their output power or risk damage to their load devices and themselves (e.g., through overheating or short circuiting) in response to a power draw that exceeds the output power limit. Even when the power draw does not exceed the output power limit, excess heat is still generated when power supply devices are operated at high output power levels.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In general, in one aspect, embodiments relate to a power supply system. The power supply system includes a power supply device with an adjustable output power limit. The power supply device includes a rectangular body having a height greater than a width. The power supply system further includes an orientation sensor that is disposed within the rectangular body and that determines an orientation of the rectangular body in a direction of gravity, and a controller. The controller receives an orientation signal from the orientation sensor, adjusts the output power limit to a first power level in response to the orientation signal indicating that the rectangular body is oriented with the width substantially parallel to the direction of gravity, and adjusts the output power limit to a second power level greater than the first power level in response to the orientation signal indicating that the rectangular body is oriented with the height substantially parallel to the direction of gravity. In addition, the controller outputs power from the power supply device at a level less than or equal to the output power limit.

In general, in one aspect, embodiments relate to a method. The method includes receiving an orientation signal from an orientation sensor that is disposed within a rectangular body of a power supply device and that determines the orientation of the rectangular body in a direction of gravity. The power supply device has an adjustable output power limit, and the rectangular body has a height greater than a width. The method further includes adjusting the output power limit to a first power level in response to the orientation signal indicating that the rectangular body is oriented with the width substantially parallel to the direction of gravity and adjusting the output power limit to a second power level greater than the first power level in response to the orientation signal indicating that the rectangular body is oriented with the height substantially parallel to the direction of gravity. In addition, the method includes outputting power from the power supply device at a level less than or equal to the output power limit.

One or more embodiments of the power supply system dynamically adjust its output power limits to provide increased amounts of power without the risks of malfunctioning, and also improve portability and user experience due to a smaller, lightweight, and cost-effective configuration over conventional power supply systems.

DETAILED DESCRIPTION

Figure 1A:
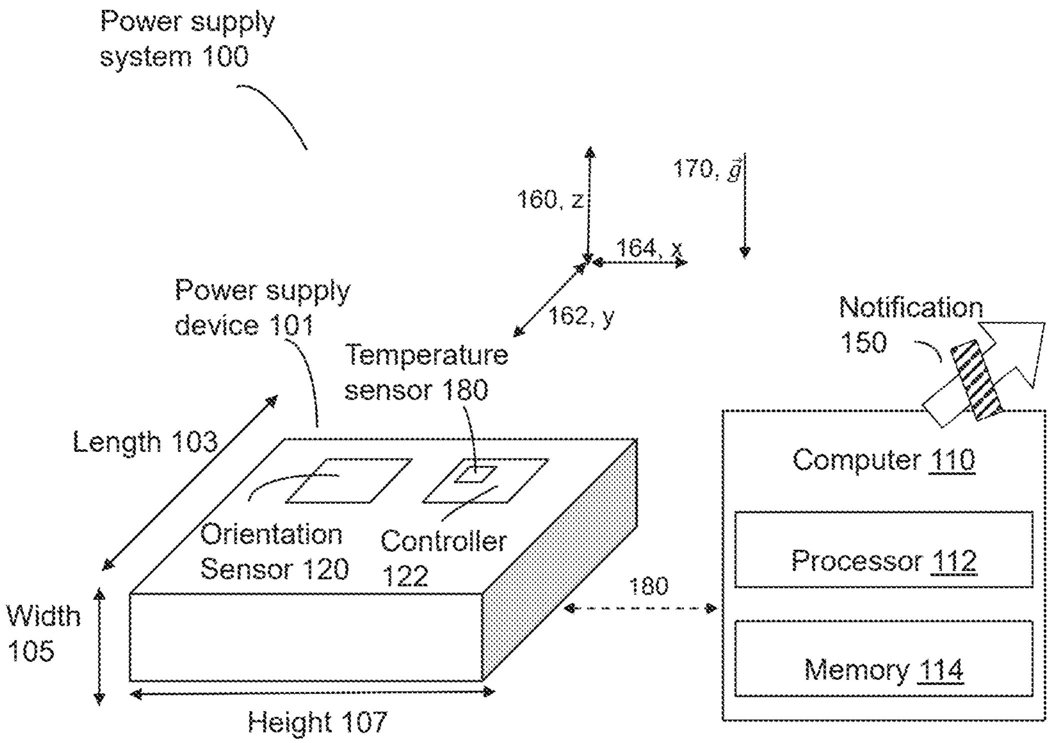
FIGS. 1A and 1B depict a power supply system in accordance with one or more embodiments of the disclosure.

Specific embodiments of the present disclosure will now be described in detail below with reference to the accompanying drawings. Like elements in the various figures are denoted by like reference numerals for consistency.

In the following detailed description of embodiments of the disclosure, numerous specific details are set forth to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third) may be used as an adjective for an element (e.g., any noun in the application). The use of ordinal numbers is not intended to imply or create a particular ordering of the elements nor to limit any element to being only a single element unless expressly disclosed, such as using the terms "before," "after," "single," and other such terminology. Rather the use of ordinal numbers is to distinguish between the elements. By way of an example, a first element is distinct from a second element, and the first element may encompass more than one element and may succeed (or precede) the second element in an ordering of elements.

Conventional power supply systems are capable of providing output power at different power levels depending on the draw of their load but must provide power at a level that is less than or equal to a fixed maximum power limit (e.g., a fixed wattage). When a load requires greater power to continue operating, an additional power supply system must typically be provided. For example, a laptop personal computer (PC) may use a power supply device (or power adapter) that provides power up to 65 W. When performing intensive processing (e.g., video editing and rendering, application multitasking, etc.), it is possible that the PC may require more power than can be provided from the power supply device. When a load draws more power than can be provided from a power supply device, there is a risk that either the load or the power supply device (or both) becomes damaged through overheating and short circuiting. Consequently, most PCs and other electronic devices are designed to draw only as much power as their standard power supply devices can safely provide. Some modern power supply devices utilize overcurrent protection, in addition to other safeguards, to shut down their power output in response to a load that draws more power than can be safely provided. Even when operating within the output power limit, conventional power supply devices can generate excessive heat when operating with high output power.

Whether or not safety mechanisms are utilized by conventional power supply devices, the user must provide a separate, more powerful power supply device to continue operating the intensive processing with the PC when the power demand exceeds the power supply or if the conventional power supply device overheats. By contrast, embodiments of the present disclosure provide a power supply system capable of dynamically adjusting its output power limit to provide increased amounts of power according to the needs of a user while maintaining safe operation (e.g., without overheating). The power supply system includes a power supply device with a lightweight and slim design made from cost-effective components for portability, space efficiency and affordability.

Figure 1B:
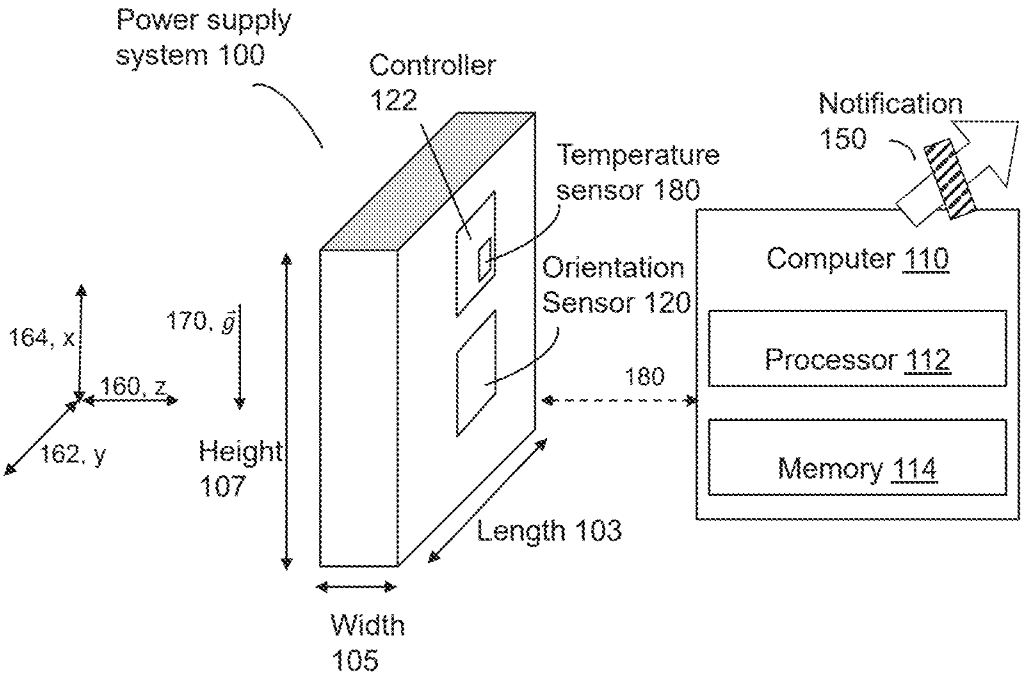

FIGS. 1A and 1B depict a power supply system (100) in accordance with one or more embodiments. The power supply system (100) includes a power supply device (101) with an adjustable output power limit. The power supply device (101) includes a rectangular body with a length (103), a width (105) extending perpendicular to the length (103), and a height (107) extending perpendicular to the length (103) and the width (105). The dimensions of the power supply device (101) may be described by a three-dimensional Cartesian coordinate system. As depicted, the length (103) extends along a y-axis (162), the width (105) extends along a z-axis (160), and the height (107) extends along an x-axis (164). The three axes (160, 162, 164) are defined with respect to the reference frame of the power supply device (101). Accordingly, the depiction of the three axes (160, 162, 164) in each figure indicates the orientation of the power supply device (101) in space. The direction of gravity is indicated by $\vec{g}$ (170) and points in the same direction in each figure. For simplicity, it is to be understood that an object oriented "vertically" is oriented substantially parallel to the direction of gravity $\vec{g}$ (170). Similarly, an "upwards" direction is substantially opposite to the direction of gravity $\vec{g}$ (170).

In FIG. 1A, the rectangular body of the power supply device (101) is oriented with the width (105) and the z-axis (160) substantially parallel to the direction of gravity $\vec{g}$ (170). Stated differently, the width (105) extends upwards from a hypothetical surface (not shown) in FIG. 1A that the power supply device (101) rests on. In FIG. 1B, the rectangular body of the power supply device (101) is rotated from its position in FIG. 1A. More specifically, in FIG. 1B, the rectangular body of the power supply device (101) is oriented with the height (107) and the x-axis (164) substantially parallel to the direction of gravity $\vec{g}$ (170). Stated differently, the height (107) extends upwards from a hypothetical surface (not shown) in FIG. 1B that the power supply device (101) rests on.

The height (107) of the rectangular body of the power supply device (101) is greater than the width (105). Consequently, the surface area spanned between the length (103) and the height (107) is greater than the surface area spanned between the width (105) and the height (107). Depending on the orientation of the power supply device (101), a different amount of surface area of the rectangular body of the power supply device (101) is exposed to the ambient air because the surface (e.g., a table, or a desk) upon which the power supply device (101) rests covers and insulates one of its sides. The rate of thermal dissipation and heat transfer between two sources at different temperatures (e.g., the power supply device (101) and the ambient air) is typically proportional to the surface area over which they are in contact. Consequently, the thermal dissipation from the power supply device (101) is dependent, at least in part, on the orientation of the power supply device (101) in, or with respect to, the direction of gravity $\vec{g}$ (170). Stated differently, the thermal dissipation from the power supply device (101) is dependent, at least in part, on which face of the power supply device (101) makes contact with the surface. When the rectangular body of the power supply device (101) is oriented with the width (105) substantially parallel to the direction of gravity $\vec{g}$ (170), with one of its two largest faces in contact with the surface, there is less surface area of the rectangular body of the power supply device (101) exposed to the ambient air than when the power supply device (101) is oriented with either the length (103) or the height (107) oriented substantially parallel to the direction of gravity $\vec{g}$ (170). The rate of heat dissipation and transfer from the power supply device (101) to the ambient air is therefore greater in the latter orientation compared to the former.

The orientation of the rectangular body of the power supply device is detected and may be continuously monitored using an orientation sensor (120) disposed within the rectangular body of the power supply device (101). In addition to the orientation, the orientation sensor (120) determines the position and movement of the power supply device (101). The orientation sensor (120) may be an accelerometer, for example, a capacitive accelerometer that detects changes in capacitance between microstructures within the sensor due to changes in its orientation or motion, or a micro-electric mechanical systems (MEMS) accelerometer that combines mechanical components (e.g., a housing, a proof mass with a suspension system holding the proof mass in place inside the housing) with electric components (e.g., capacitive sensors or piezoresistive/piezoelectric sensors). The orientation sensor (120) may be operable within temperatures less than or equal to 105 degrees Celsius.

The power supply system (100) includes a controller (122) that manages and regulates input and output voltages ("power management") in response to varying load conditions. Although only one controller (122) is shown in the drawings, a person of ordinary skill in the art will understand that a controller (122) may be composed of various constituent components. For example, the controller (122) may include a microcontroller that includes a processing unit, a memory, and input/output ports. The controller (122) may also include digital signal controllers and/or an application specific integrated circuit (ASIC) for combining power management tasks, such as a power delivery integrated circuit (PD IC). Generally, the controller (122) is part of the power supply device (101), as illustrated in FIGS. 1A and 1B. The controller (122) enacts various protective features for the power supply device (101), including overcurrent, overvoltage, overtemperature, overpower, and short circuit protection. For example, to provide overtemperature protection, the controller (122) includes a temperature sensor (180). In one or more embodiments, the power supply device (101) may include a temperature sensor (180) that is separate from the controller (122). The temperature sensor (180) measures the temperature of the power supply device (101), and the measured temperature can be used by the controller (122) to regulate output power (e.g., lowering the output power in response to a high temperature).

One of the functions of the controller (122) is to set, or define, the output power limit of the power supply device (101). Conventional power supply devices are built with a fixed output power limit that cannot be changed, and the output power at any given moment must remain below the fixed output power limit. In addition, conventional power supply devices are not designed with any particular orientation in mind. By contrast, the power supply device (101) of the present disclosure has an adjustable output power limit that is related to its orientation in space, in accordance with one or more embodiments. The controller (122) is communicatively coupled to the orientation sensor (120). The orientation sensor (120) continually monitors or measures the orientation of the rectangular body of the power supply device (101) and transmits a signal to the controller (122) that indicates the orientation of the rectangular body of the power supply device (101). In response to the orientation signal indicating that the rectangular body of the power supply device (101) is oriented with the width (105) substantially parallel to the direction of gravity ng (170), the controller (122) adjusts the output power limit of the power supply device (101) to a first power level. In response to the orientation signal indicating that the rectangular body of the power supply device (101) is oriented with the height (107) substantially parallel to the direction of gravity $\vec{g}$ (170), the controller (122) adjusts the output power limit of the power supply device (101) to a second power level greater than the first power level.

According to the orientation of the power supply device (101) in FIG. 1A, the output power limit is set to the first power level. After the power supply device (101) has been rotated to the orientation of the power supply device (101) depicted in FIG. 1B, the output power limit is set to the second power level. It is to be understood that it is not necessary for the power supply device (101) to begin in any particular orientation. However, upon the power supply device (101) being placed in one of the orientations described above, the output power limit is set or adjusted accordingly. As such, the controller (122) may be configured to automatically adjust output power limit from the power supply device (101) in response to a change in the orientation signal. During operation, the controller (122) regulates the output power from the power supply device (101) at a level less than or equal to the output power limit.

The first and second power levels may be configured depending on the load. In one or more embodiments, the first power level is 180 W and the second power level is 240 W. However, a person of ordinary skill in the art will understand that embodiments of the present disclosure are not limited to these particular power ranges, and that the output power limit may be configured to different values depending on the application.

As described above, conventional power supply devices operate with a fixed output power limit. When power supply devices operate at their maximum output power (i.e., the output power limit), a large amount of heat is generated by AC/DC conversion, switching losses, voltage drop and internal resistance, etc. When a load draws increasing amounts of energy from a power supply device, it is possible that the load or the power supply device (or both) becomes damaged through overheating and short circuiting. Consequently, the output power limit is generally selected such that the power supply device does not overheat. In some cases, the output power limit is set such that the power supply device cannot physically overheat even if operated at the maximum output power for extended periods of time (e.g., a particular threshold in output power may determined through laboratory testing). Alternatively, power supply devices may regulate output power based on a measured temperature. In any case, the output power limit of a power supply device may be restricted, at least in part, by the thermal dissipation properties of the power supply device.

As described above, embodiments of the present disclosure provide a power supply device (101) that has substantially different thermal dissipation properties depending on its orientation in space. To reiterate, under the configuration depicted in FIG. 1A, where the width (105) of the rectangular body of the power supply device (101) is oriented substantially parallel to the direction of gravity $\vec{g}$ (170), the power supply device (101) dissipates heat less efficiently compared to the configuration depicted in FIG. 1B, where the height (107) is oriented substantially parallel to the direction of gravity $\vec{g}$ (170). This is due to the difference in surface area that exposed to the ambient air depending on the orientation of the rectangular body of the power supply device (101) and its consequent contact with the surface upon which it rests.

Figure 2A:
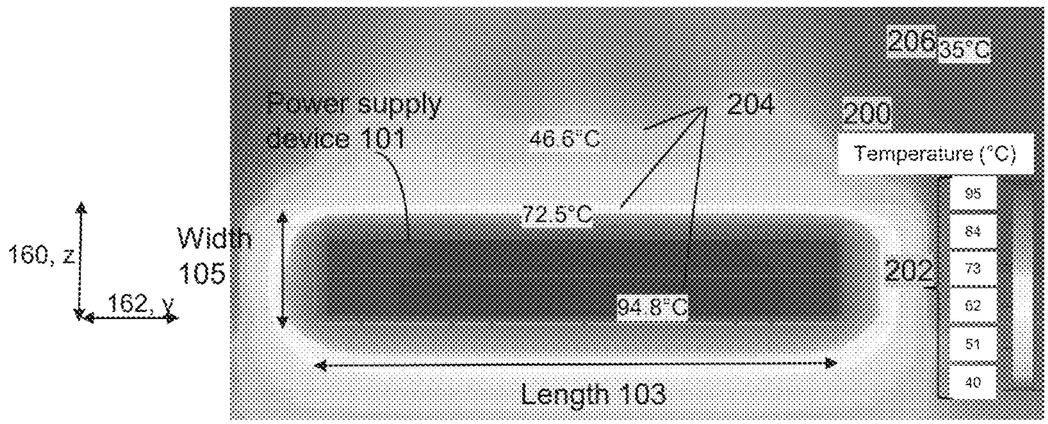
FIGS. 2A and 2B depict heatmaps of a power supply device in accordance with one or more embodiments of the disclosure.
Figure 2B:
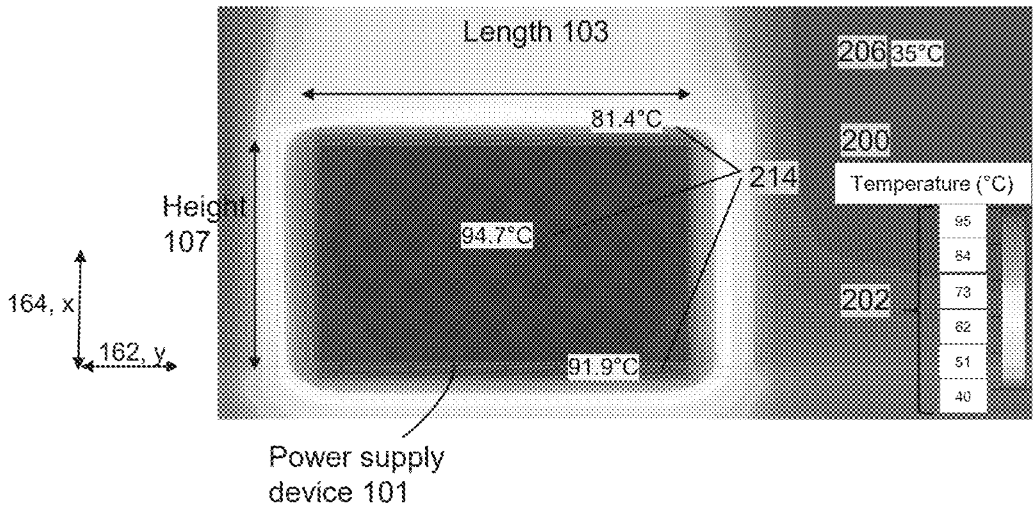

FIGS. 2A and 2B depict heatmaps of the power supply device (101) in accordance with one or more embodiments. The heatmaps depict temperature (200) as a function of position in the vicinity of the power supply device (101). More specifically, FIGS. 2A and 2B depict simulations of the power supply device (101) according to an example configuration. As such, it is to be understood that the exact values for various properties of the power supply device (101) and its environment that are described in reference to FIGS. 2A and 2B below are not to be considered limiting but are provided for the purpose of illustration.

The value of the temperature at each position in the heatmaps is indicated by the color bar (202). In both FIGS. 2A and 2B, the ambient temperature (206) is 35° C. The simulated power supply device (101) has a length (103) of 128 mm, a width (105) of 23.7 mm, and a height (107) of 66 mm. Therefore, the total volume of the power supply device (101) is 200 cubic centimeters, representing a compact and slim design. In FIG. 2A, the power supply device (101) is oriented similarly to the orientation depicted in FIG. 1A but from a view directly parallel to the x-axis (164), the direction of extension of the height (107). Accordingly, the width (105) is oriented substantially parallel to the direction of gravity $\vec{g}$ (170) in FIG. 2A. In FIG. 2B, the power supply device (101) is oriented similarly to the orientation depicted in FIG. 1B but from a view directly parallel to the z-axis (160), the direction of extension of the width (105). Accordingly, the height (107) is oriented substantially parallel to the direction of gravity $\vec{g}$ (170) in FIG. 2B. The output power limit of the power supply device (101) is set to the first power level in the configuration depicted in FIG. 2A and the second power level in the configuration depicted in FIG. 2B, respectively.

FIGS. 2A and 2B both depict the power supply device (101) operating at 240 W output power. As such, in FIGS. 2A and 2B, the first power level is at least 240 W and the second power level is greater than 240 W. In order to output power at 240 W, more than 240 W is consumed by the power supply device (101) due to various sources of energy loss. For example, some amount of energy is lost as heat. In both FIGS. 2A and 2B, various locations in the proximity of the power supply device (101) have greater temperatures (204, 214) than the ambient temperature (206) due to heat released from the power supply device (101). The amount of energy lost due to heat is referred to as the power loss, and larger values of power loss correspond to greater heat generation. The efficiency of the power supply device (101) is defined as the amount of power that is output relative to the total amount of power consumed. For both the safety of users and the longevity of the electrical components, it is important that the rectangular body of the power supply device (101) does not exceed a predetermined temperature threshold. The exact value of the temperature threshold may depend on the material of the rectangular body, the material of the internal electrical components, and energy efficiency goals. The temperature threshold may be defined with respect to the average temperature of the rectangular body of the power supply device (101), or another summary statistic such as the median temperature. In some instances, it may be preferred that the heat of the power supply device is uniformly distributed. As such, the temperature threshold may be defined with respect to the variation in temperature (e.g., the standard deviation) over a predetermined number of locations on the rectangular body of the power supply device (101). The temperature threshold may also be defined as a change in temperature relative to a reference temperature, for example, the ambient temperature (206). In the examples considered in FIGS. 2A and 2B, the temperature threshold is defined as an average change of 55° C. across the rectangular body of the power supply device when the ambient temperature (206) is 35° C.

As described above, the power supply device (101) dissipates heat more efficiently when it is oriented with the height (107) substantially parallel to the direction of gravity $\vec{g}$ (170), as depicted in FIG. 2B, compared to when it is oriented with the width (105) substantially parallel to the direction of gravity $\vec{g}$ (170), as depicted in FIG. 2A. Therefore, the rectangular body of the power supply device (101) may remain at lower temperatures despite a greater amount heat generation (power loss) in the configuration depicted in FIG. 2B compared to the configuration depicted in FIG. 2A. Under the simulated conditions of the examples provided herein, the maximum power loss (while remaining below the stated temperature threshold) of the configuration in FIG. 2A is 13.2 W while the maximum power loss (while remaining below the stated temperature threshold) of the configuration of FIG. 2B is 15.9 W. In practice, the simulations showed that while outputting 240 W of power, the rectangular body of the power supply device (101) increased in temperature (on average) by 49.6° C. in the configuration of FIG. 2B, while the rectangular body of the power supply device (101) increased in temperature (on average) by 53.5° C. in the configuration of depicted in FIG. 2A. Therefore, in view of the stated temperature threshold of an average change of 55° C. when the ambient temperature (206) is 35° C., the configuration of FIG. 2B provides significantly greater margin and therefore reliability due to its superior heat dissipation.

Returning to FIGS. 1A and 1B, embodiments of the power supply system (100) disclosed herein may include the power supply device (101) and a computer (110) electrically coupled to the power supply device (101). The power supply device (101) provides power to the computer (110) through the electrical coupling (e.g., through an electrical cable with USB-C or other standard connectivity) depicted as the dashed arrow (180) in FIGS. 1A and 1B. A computer (110), as referenced herein, is intended to encompass any computing device such as a server, desktop computer, laptop computer, smart phone, personal data assistant (PDA), tablet computing device, one or more processors within these devices, or any other suitable processing device, including both physical or virtual instances (or both) of the computing device. The computer (110) can include one or more auxiliary devices, for example, to receive inputs and process or display outputs. Auxiliary devices can include a keypad, keyboard, touch screen, or other input device that can accept user information (e.g., joystick). Auxiliary devices can further include a computer screen or other output device that conveys information associated with the operation of the computer system, including digital data, visual, or audio information (or a combination of information), or a graphical user interface.

The computer (110) includes one or more computer processors (112) and data storage, or memory (114) such as one or more of a non-persistent storage (e.g., volatile memory, such as random access memory (RAM), cache memory) and a persistent storage (e.g., a hard disk, an optical drive such as a compact disk (CD) drive or digital versatile disk (DVD) drive, a flash memory, etc.). The processor (112) may be part or all of an integrated circuit for processing instructions stored on the memory (114). For example, the processor (112) may be or include one or more cores or micro-cores. The computer (110) can further include a communication interface, which may include an integrated circuit for connecting to a network (e.g., a local area network (LAN), a wide area network (WAN) such as the Internet, mobile network, or any other type of network) and/or to another device.

The memory (114) of the computer (110) includes instructions stored thereon that, when executed, cause the processor (112) to perform various steps. More specifically, the instructions cause the processor (112) to measure the power demand of the computer (110), which is the amount of power needed to maintain the operation of the computer (110). The power demand may quantify the current power demand at the time of measurement, i.e., the instantaneous power draw, or a power demand at a moment in time in the future based on recorded power usage analytics. Alternatively, or in addition, the power demand may quantify the power demand based on a request of a user. For example, the user may attempt to initialize a process, prompting the computer (110) to measure the power demand of the current computer processes as well as the requested process. The power demand of the computer (110) may vary depending on the use of the computer (110). When performing computationally intensive processes, the computer (110) consumes greater power. If the power demand of the computer (110) is greater than the amount of power that is being provided thereto, the computer (110) may cease to function. In some embodiments, the computer (110) also includes a battery that provides auxiliary power to the computer (110) and that may prevent the computer from immediately ceasing to function when the power demand exceeds the power being provided. However, the battery will nonetheless eventually run out of power too when the power demand exceeds the amount of power being provided.

The instructions cause the processor (112) of the computer (110) to detect the current output power limit of the power supply device (101). The power supply device (101) may communicate this information to the computer (110) from the controller (122) through the electrical coupling (180) through which they are connected. For example, the controller (122) may include a power delivery integrated circuit (PD IC) that communicates information, including the output power limit, to the computer (110) through the I2C protocol. After detecting the output power limit of the power supply device (101), the instructions cause the processor (112) to calculate whether the power demand of the computer (110) is greater than or less than the output power limit of the power supply device (101). The calculation determines whether the computer is receiving enough power to maintain its current processes, or in some cases, to perform additional processes. In response to the calculation, the instructions cause the processor (112) to provide, or transmit, a notification (150) to a user to change the orientation of the rectangular body of the power supply device (101) to adjust its output power limit. However, the notification may contain additional or alternative information as described below.

The information content of the notification (150) depends on the current orientation of the rectangular body of the power supply device (101), the values of the first and second power levels, and the power demand of the computer (110). For example, if the rectangular body of the power supply device (101) is oriented as depicted in FIG. 1A (and therefore the output power limit is set to the first power level), and the power demand of the computer (110) is greater than the first power level, then the notification (150) requests the user to change the orientation of the power supply device to the orientation depicted in FIG. 1B, thereby increasing the output power limit from the first power level to the second power level. However, if the power demand is lower than the first level, then no change may be needed. Nonetheless, in one or more embodiments, the notification (150) may still request the user to change the orientation of the rectangular body of the power supply device (101) for other reasons, for example, to improve charging of the battery or to apply a software update or other process in the background (i.e., without the user's active participation).

If the rectangular body of the power supply device (101) is oriented as depicted in FIG. 1B (and therefore the output power limit is set to the second power level), and the power demand of the computer (110) is less than the second power level, then the notification (150) may request the user to change the orientation of the power supply device to the orientation depicted in FIG. 1A, thereby decreasing the output power limit from the second power level to the first power level. The power supply device (101) is configured to regulate the output power at a rate that is less than or equal to the output power limit. Since the power demand of the computer (110) is below the second power level in this example, it may not be necessary to change the orientation of the power supply device (101). Therefore, the notification (150) may inform the user that it is safe to change the orientation of the rectangular body of the power supply device (101) but not necessary. Alternatively, the notification (150) may not be sent when there is no need to change the output power limit. If the power demand of the computer (110) is greater than the second power level, then the notification (150) may inform the user that the computer may cease to function properly, or the battery of the computer will run out quickly.

The memory (114) of the computer (110) may include additional instructions stored thereon that, when executed, cause the processor (112) to perform additional steps. For example, the instructions may cause the processor to obtain or receive a temperature of the power supply device (101) measured by the temperature sensor (180). Then, the processor may calculate whether the temperature is greater than or less than a predetermined temperature threshold, where the predetermined temperature threshold is determined based on the safe operation of the power supply device (101). For example, in one or more embodiments, the predetermined temperature threshold may be 100 degrees Celsius. However, a person of ordinary skill in the art will recognize that other predetermined temperature thresholds may be used depending on the composition or structure and internal layout of the individual components of the power supply device (101).

The computer (110) may notify a user to change the orientation of the rectangular body of the power supply device (101) in response to the temperature being greater than the predetermined temperature threshold. Such a scenario may correspond to operating the power supply device (101) while the width (105) is oriented substantially parallel to the direction of gravity $\vec{g}$ (170), as depicted in FIGS. 1A and 2A, where the power supply device (101) does not dissipate heat as efficiently. If the temperature of the power supply device (101) is above the predetermined temperature threshold, then a notification (150) may be provided to the user to rotate the power supply device (101) so that the height (107) is oriented substantially parallel to the direction of gravity $\vec{g}$ (170), as depicted in FIGS. 1B and 2B, so that the power supply device (101) dissipates heat more efficiently thereby preventing overheating.

Figure 3A:
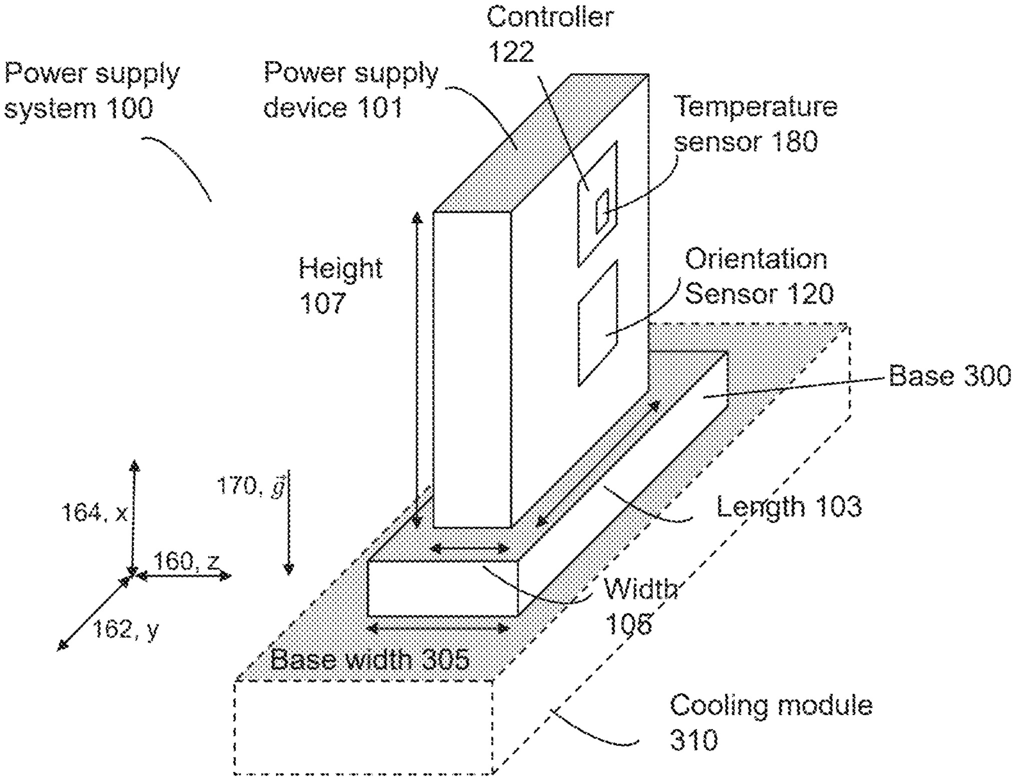
FIGS. 3A and 3B depict a power supply system in accordance with one or more embodiments of the disclosure.
Figure 3B:
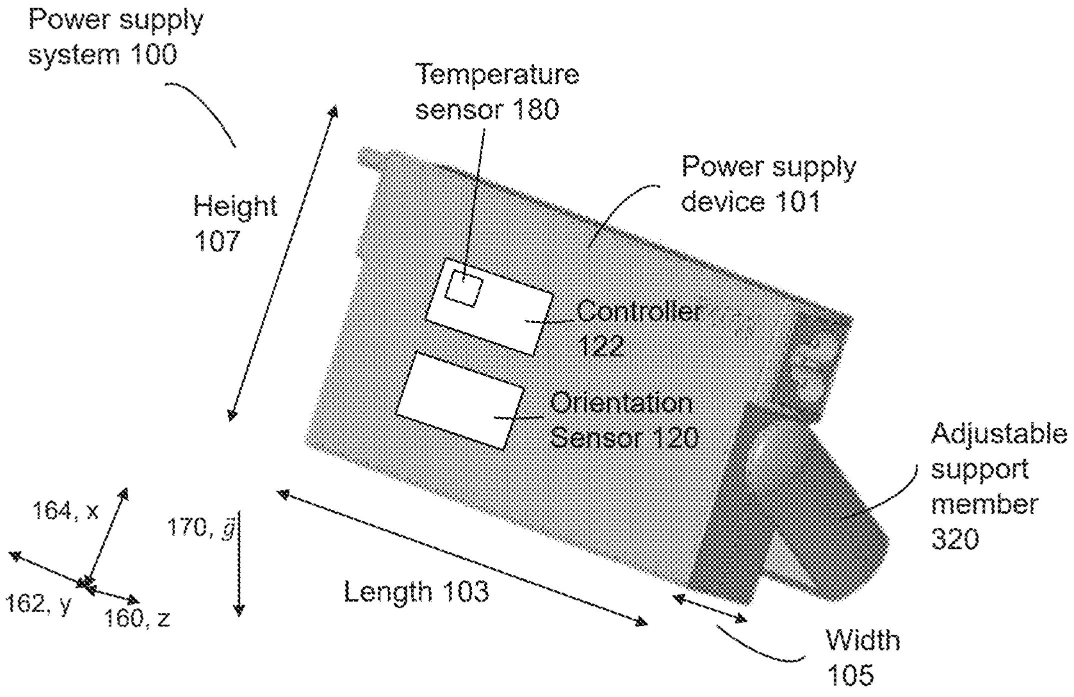

FIGS. 3A and 3B depict the power supply system (100) in accordance with one or more embodiments. In FIG. 3A, the rectangular body of the power supply device (101) includes a base (300). The base (300) is arranged along one or both of the faces spanned between the length (103) and the width (105). In addition, the base (300) has a base width (305) that is greater than the width (105) of the body of the rectangular power supply device (101). Accordingly, the base (300) supports the rectangular body of the power supply device (101) in an orientation where the height (107) is substantially parallel to the direction of gravity $\vec{g}$ (170).

FIG. 3A further depicts a cooling module (310). The cooling module (310) is configured to be attached to the power supply device (101). When the cooling module (310) is attached to the power supply device (101), the output power limit of the power supply device (101) is adjusted to a third power level that is greater than the second power level. The cooling module (310) acts as a heat exchanger and may include a fan to increase the thermal dissipation efficiency of the power supply device (101). However, to emphasize that the cooling module (310) is not needed to operate the power supply device (101) within the first and second power levels, the cooling module (310) is depicted with dashed lines.

Embodiments of the power supply device (101) that include the cooling module (310), such as the one depicted in FIG. 3A, may provide additional functionality when electrically coupled to the computer (110). For example, consider the power supply device (101) oriented as depicted in FIG. 3A, with the height (107) substantially parallel to the direction of gravity $\vec{g}$ (170) and the output power limit set to the second power level. The processor (112) of the computer (110) measures the power demand of the computer (110) and calculates whether the power demand is greater than the output power limit (in this case, the second power level). If the power demand of the computer (110) is greater than the second power level, rather than providing a notification (150) to the user that the computer may cease to function properly, or that the battery may quickly run out, the computer (110) may provide a notification (150) to the user to attach the cooling module (310). After attaching the cooling module (310), the output power limit is adjusted to the third power level. The user may also be notified to attach the cooling module (310) in response to the temperature of the power supply device (101) being greater than the predetermined temperature threshold to prevent overheating.

In FIG. 3B, the rectangular body of the power supply device (101) includes an adjustable support member (320). Similar to the base (300), the adjustable support member (320) is configured to support the rectangular body of the power supply device (101) in an orientation where the height is substantially parallel to the direction of gravity $\vec{g}$ (170). Note that in FIG. 3B, the height (107) is not exactly parallel to the direction of gravity $\vec{g}$ (170), and the three axes (160, 162 164) are rotated slightly in comparison to their orientation in FIG. 3A. Nonetheless, the substantial alignment of the height (107) with the direction of gravity $\vec{g}$ (170) still ensures that large fraction of the surface area of the rectangular body power supply device (101) is exposed to ambient air. As such, embodiments of the present disclosure according to the configuration of FIG. 3B may still operate with greater thermal dissipation, and therefore higher power levels, compared to configurations where the width (105) is substantially parallel to the direction of gravity $\vec{g}$ (170).

Figure 4:
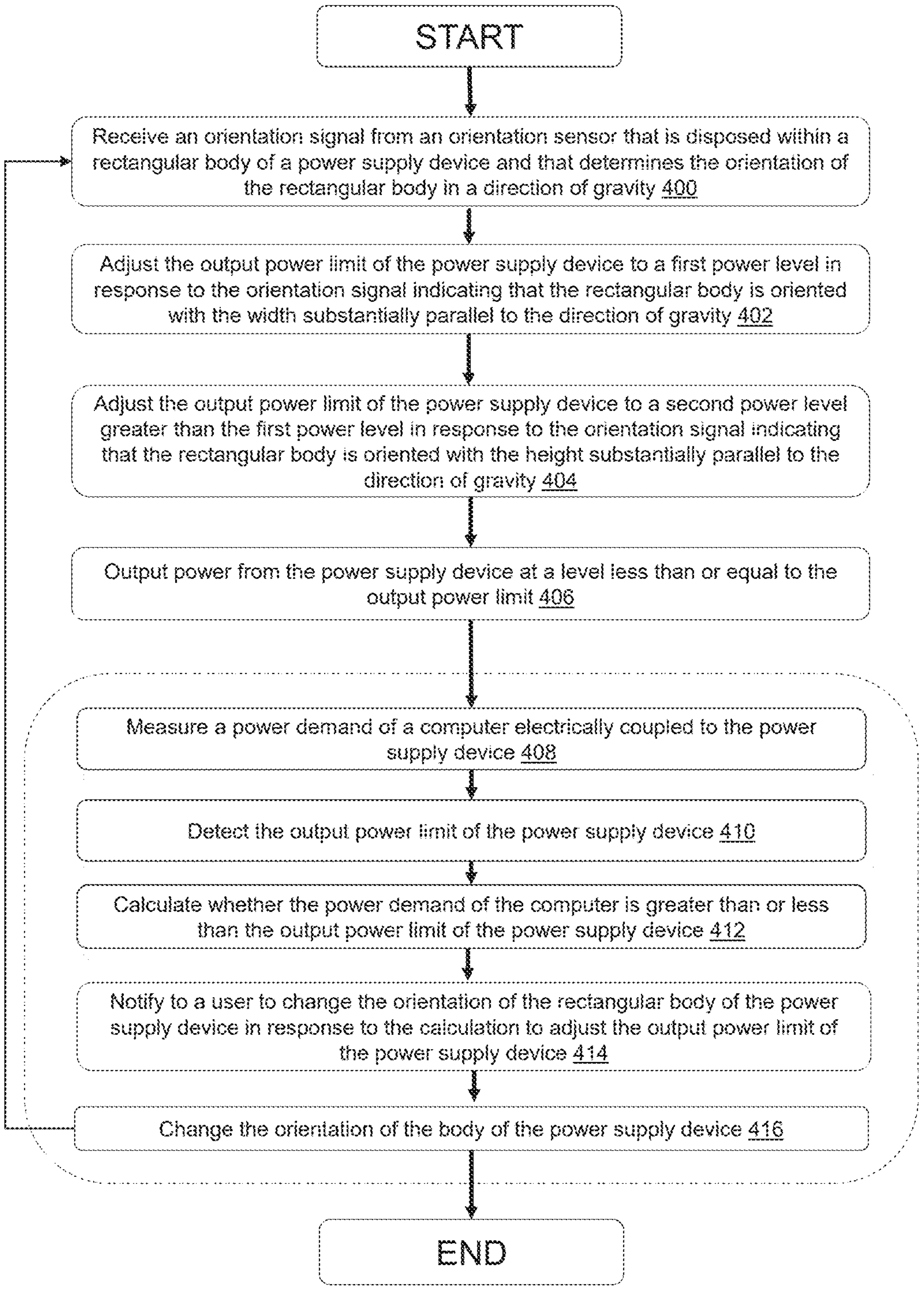
FIG. 4 depicts a method for operating a power supply system in accordance with one or more embodiments of the disclosure.

FIG. 4 depicts a method in accordance with one or more embodiments. The steps of the method of FIG. 4 can be performed using a controller (122) of a power supply device (101) as part of a power supply system (100). The steps depicted within the dashed box may be performed with a computer (110) that is part of the power supply system (100).

In Step 400, an orientation signal is received from an orientation sensor (120) that is disposed within the rectangular body of the power supply device (101) and that determines the orientation of the rectangular body in a direction of gravity $\vec{g}$ (170). The rectangular body of the power supply device (101) has a length (103), a width (105) extending perpendicular to the length (103), and a height (107) extending perpendicular to the length (103) and the width (105). The height (107) is greater than the width (105), thereby providing the body of the power supply device (101) with a rectangular shape. The orientation signal describes the orientation of the rectangular body of the power supply device (101) with respect to the direction of gravity $\vec{g}$ (170). As such, the orientation signal effectively describes which side or face the power supply device (101) rests upon.

In Step 402, the output power limit of the power supply device (101) is adjusted to a first power level in response to the orientation signal indicating that the rectangular body of the power supply device (101) is oriented with the width (105) substantially parallel to the direction of gravity $\vec{g}$ (170). Under this orientation, one of the two largest faces of the power supply device (101) is in contact with the surface that the power supply device (101) rests upon, and the amount of exposed surface area is significantly smaller than the total surface area of the power supply device (101). In Step 404, the output power limit of the power supply device (101) is adjusted to a second power level greater than the first power level in response to the orientation signal indicating that the rectangular body of the power supply device (101) is oriented with the height (107) substantially parallel to the direction of gravity $\vec{g}$ (170). Under this orientation, both of the largest faces of the power supply device (101) are exposed to the ambient air, and the amount of exposed surface area is more similar to the total surface area of the power supply device (101). The greater amount of exposed surface area enables greater thermal dissipation, making it safer to operate the power supply device (101) at a higher power output level. In Step 406, power is output from the power supply device at a level less than or equal to the output power limit.

Steps 408-416 may be carried out with a computer (110) electrically coupled to the power supply device (101), and these steps may be stored on memory (114) as instructions to be executed by the processor (112) of the computer (110). At Step 408, the power demand of the computer (110) is measured. The power demand varies depending on the activity of the computer (110) and may include the power required to support the current computer processes as well as additional (e.g., requested) computer processes. At Step 410, the output power limit of the power supply device (101) is detected. This information may be communicated from the controller (122) to the computer through standard protocols, e.g., I2C. At Step 412, a calculation is performed to determine whether the power demand of the computer (110) is greater than or less than the output power limit of the power supply device (101). At Step 414, a user of the computer (110) is notified to change the orientation of the rectangular body of the power supply device (101) in response to the calculation. Various examples of notifications have been provided above corresponding to different use scenarios. In one or more embodiments, the computer (110) may receive a temperature of the power supply device (101) measured by the temperature sensor (180), calculate whether the temperature is greater than or less than a predetermined temperature threshold, and notify the user to change the orientation of the rectangular body of the power supply device (101) in response to the temperature being greater than the predetermined temperature threshold.

In Step 416, the orientation of the rectangular body of the power supply device (101) is changed, thereby adjusting the output power limit of the power supply device (101). Afterwards, power is output from the power supply device (101) at a level less than or equal to the output power limit.

Although Steps 408-416 are described as being carried out by the computer (110), it is also possible for these steps to be carried out by the power supply device (101) itself. In such embodiments, the notification may be sent from the power supply device (101) to the computer (110). In addition, while the power supply device (101) is in use, the power supply device (101) may record its own temperature via the temperature sensor (180). In some embodiments, the power supply device (101) may calculate whether the temperature is greater than or less than a predetermined temperature threshold, and notify the user to change the orientation of the rectangular body of the power supply device (101) in response to the temperature being greater than the predetermined temperature threshold.

The method of FIG. 4 can be executed repeatedly (e.g., in a loop) to continually provide guidance to a user for operating the power supply device. Accordingly, changing the orientation of the rectangular body of the power supply device (101) at Step 416 may be immediately followed by Step 400, where the orientation signal is received.

Embodiments of the disclosure have one or more of the following advantages. The power supply systems disclosed herein allow users to freely operate their electronic devices, such as computers, at a wide range of energy levels but with a single, multi-function power supply device. This is made possible by the power supply device that has substantially different thermal dissipation properties depending on its orientation in space; by changing the orientation of the power supply device, the thermal dissipation efficiency increases, thereby allowing the power supply device to safely operate at higher power output or to continue operating at the same power output when the temperature of the power supply device rises above a predetermined temperature threshold. The orientation sensor enables the power supply device to change its output power level with minimal user interaction by merely changing the orientation of the rectangular body of the power supply device. This feature is further supported by power demand monitoring by the computer, which may guide a user when to change the orientation of the power supply device using notifications. In addition, embodiments of the present disclosure also provide a safety feature of preventing the power supply device from overheating by monitoring the temperature of the power supply device and providing various options to improve the heat dissipation therefrom and notifications indicating when they are needed.

Overall, the unique design removes the need for additional power supply devices and provides greater freedom of use of user devices. In addition, the internal design of the power supply device disclosed herein may be constructed from affordable components. For example, by utilizing a large, exposed surface area, the primary circuit of the power supply device may be built upon a "traditional" diode (single piece) bridge while still maintaining high thermal dissipation. Although more sophisticated components may be used for high energy efficiency, e.g., an active MOSFET bridge, they are often significantly more expensive and provide only marginally improved energy efficiency.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A power supply system, comprising:
a power supply device with an adjustable output power limit, the power supply device comprising a rectangular body having a height greater than a width;
an orientation sensor that is disposed within the rectangular body and that determines an orientation of the rectangular body in a direction of gravity; and
a controller that:
receives an orientation signal from the orientation sensor,
adjusts the output power limit to a first power level in response to the orientation signal indicating that the rectangular body is oriented with the width substantially parallel to the direction of gravity,
adjusts the output power limit to a second power level greater than the first power level in response to the orientation signal indicating that the rectangular body is oriented with the height substantially parallel to the direction of gravity, and
outputs power from the power supply device at a level less than or equal to the output power limit.

2. The power supply system according to claim 1, wherein the controller automatically adjusts output power limit from the power supply device in response to a change in the orientation signal.

3. The power supply system according to claim 1, wherein the first power level is 180 W and the second power level is 240 W.

4. The power supply system according to claim 1, wherein the power supply device further comprises a base having a width that is greater than the width of the rectangular body, wherein the base supports the rectangular body in an orientation in which the height of the rectangular body is substantially parallel to the direction of gravity.

5. The power supply system according to claim 1, further comprising an adjustable support member that supports the rectangular body in an orientation in which the height is substantially parallel to the direction of gravity.

6. The power supply system according to claim 1, wherein the orientation sensor is operable within temperatures greater than −40 degrees Celsius and less than 85 degrees Celsius.

7. The power supply system according to claim 1, wherein a volume of the power supply device defined by a length, the width, and the height of the power supply device is less than or equal to 200 cubic centimeters.

8. The power supply system according to claim 1, further comprising:
a computer electrically coupled to the power supply device, the computer comprising a memory and a processor, wherein
the memory comprises instructions stored thereon that, when executed by the processor, cause the processor to:
measure a power demand of the computer and detecting the output power limit of the power supply device;
calculate whether the power demand of the computer is greater than or less than the output power limit of the power supply device; and
notify a user to change the orientation of the rectangular body of the power supply device in response to the calculation to adjust the output power limit of the power supply device.

9. The power supply system according to claim 8:
wherein the power supply device further comprises a temperature sensor;
wherein the memory of the computer further comprises instructions stored thereon that, when executed by the processor, cause the processor to:
receive a temperature of the power supply device measured by the temperature sensor,
calculate whether the temperature is greater than or less than a predetermined temperature threshold, and
notify the user to change the orientation of the rectangular body of the power supply device in response to the temperature being greater than the predetermined temperature threshold.

10. The power supply system according to claim 1, further comprising a cooling module configured to be attached to the power supply device, cool the power supply device, and adjust the output power limit of the power supply device to a third power level greater than the second power level.

11. A method, comprising:
receiving an orientation signal from an orientation sensor that is disposed within a rectangular body of a power supply device and that determines the orientation of the rectangular body in a direction of gravity;
wherein the power supply device has an adjustable output power limit;
wherein the rectangular body has a height greater than a width;
adjusting the output power limit to a first power level in response to the orientation signal indicating that the rectangular body is oriented with the width substantially parallel to the direction of gravity;

adjusting the output power limit to a second power level greater than the first power level in response to the orientation signal indicating that the rectangular body is oriented with the height substantially parallel to the direction of gravity; and outputting power from the power supply device at a level less than or equal to the output power limit.

12. The method of claim 11, further comprising:

measuring a power demand of a computer electrically coupled to the power supply device, detecting the output power limit of the power supply device with the computer;

calculating whether the power demand of the computer is greater than or less than the output power limit of the power supply device;

notifying a user to change the orientation of the rectangular body of the power supply device in response to the calculation to adjust the output power limit of the power supply device.

13. The method of claim 12, further comprising:

notifying a user to attach a cooling module to the power supply device in response to the calculation of whether the power demand of the computer is greater than or less than the output power limit of the power supply device;

attaching the cooling module to the power supply device; and adjusting the output power limit of the power supply device to a third power level greater than the second power level.

14. The method of claim 11, further comprising:

receiving a temperature of the power supply device measured by a temperature sensor disposed within the power supply device, calculating whether the temperature is greater than or less than a predetermined temperature threshold, and notifying a user to change the orientation of the rectangular body of the power supply device in response to the temperature being greater than the predetermined temperature threshold.

* * * * *